(12) United States Patent
Yoneda et al.

(10) Patent No.: US 7,872,844 B2
(45) Date of Patent: Jan. 18, 2011

(54) COMPOSITE ELECTRONIC DEVICE

(75) Inventors: Naotsugu Yoneda, Fukui (JP); Kenji Ueno, Fukui (JP)

(73) Assignee: Panasonic Corporation, Osaka (JP)

( * ) Notice: Subject to any disclaimer, the term of this patent is extended or adjusted under 35 U.S.C. 154(b) by 492 days.

(21) Appl. No.: 12/066,050

(22) PCT Filed: Sep. 1, 2006

(86) PCT No.: PCT/JP2006/317327

§ 371 (c)(1),
(2), (4) Date: Mar. 6, 2008

(87) PCT Pub. No.: WO2007/029615

PCT Pub. Date: Mar. 15, 2007

(65) Prior Publication Data

US 2009/0154052 A1  Jun. 18, 2009

(30) Foreign Application Priority Data

Sep. 7, 2005  (JP) ............................. 2005-258790

(51) Int. Cl.
*H02H 9/06* (2006.01)
*H02H 1/00* (2006.01)
(52) U.S. Cl. .................................................. 361/120
(58) Field of Classification Search .................. 361/120
See application file for complete search history.

(56) References Cited

U.S. PATENT DOCUMENTS 3,900,767 A * 8/1975 Person ....................... 361/118
7,067,914 B2 * 6/2006 Malinowski et al. ........ 257/723
7,085,118 B2 8/2006 Inoue et al.
2003/0089979 A1 * 5/2003 Malinowski et al. ........ 257/724
2004/0233606 A1 11/2004 Inoue et al.

FOREIGN PATENT DOCUMENTS

| BB | 2004-311877 | | 11/2004 |
|---|---|---|---|
| DE | 10259035 A1 | * | 7/2004 |
| JP | 8-250309 | | 9/1996 |
| JP | 2003-123936 | | 4/2003 |
| JP | 2005-93836 | | 4/2005 |

OTHER PUBLICATIONS

International Search Report issued Dec. 5, 2006 in the International (PCT) Application No. PCT/JP2006/317327.

* cited by examiner

*Primary Examiner*—Ronald W Leja
(74) *Attorney, Agent, or Firm*—Wenderoth, Lind & Ponack, L.L.P.

(57) ABSTRACT

A composite electronic device includes: a coil conductor arranged on at least one of a plurality of insulating layers; a drawing conductor arranged on another insulating layer and partially facing the coil conductor and having one end electrically connected to one end of the coil conductor so as to constitute an inductor in combination with the coil conductor for passing an external signal; an internal conductor having one end formed in the vicinity of a part of the coil conductor on one surface of the insulating layer where the coil conductor is arranged so that static electricity generated in the inductor is discharged to the one end and the discharged static electricity is released from the other end to the ground; and a via electrode for electrically connecting the one end of the coil conductor to the one end of the pull-out conductor. A part of the coil conductor and the internal conductor constitutes a static electricity regulator.

15 Claims, 9 Drawing Sheets

COMPOSITE ELECTRONIC DEVICE

TECHNICAL FIELD

The present invention relates to a composite electronic device which is used for various kinds of electronic apparatus such as digital apparatus, AV (audio/video) apparatus and an information communication terminal, and is adapted for filtering a noise or regulating static electricity.

BACKGROUND ART

Figure 9:
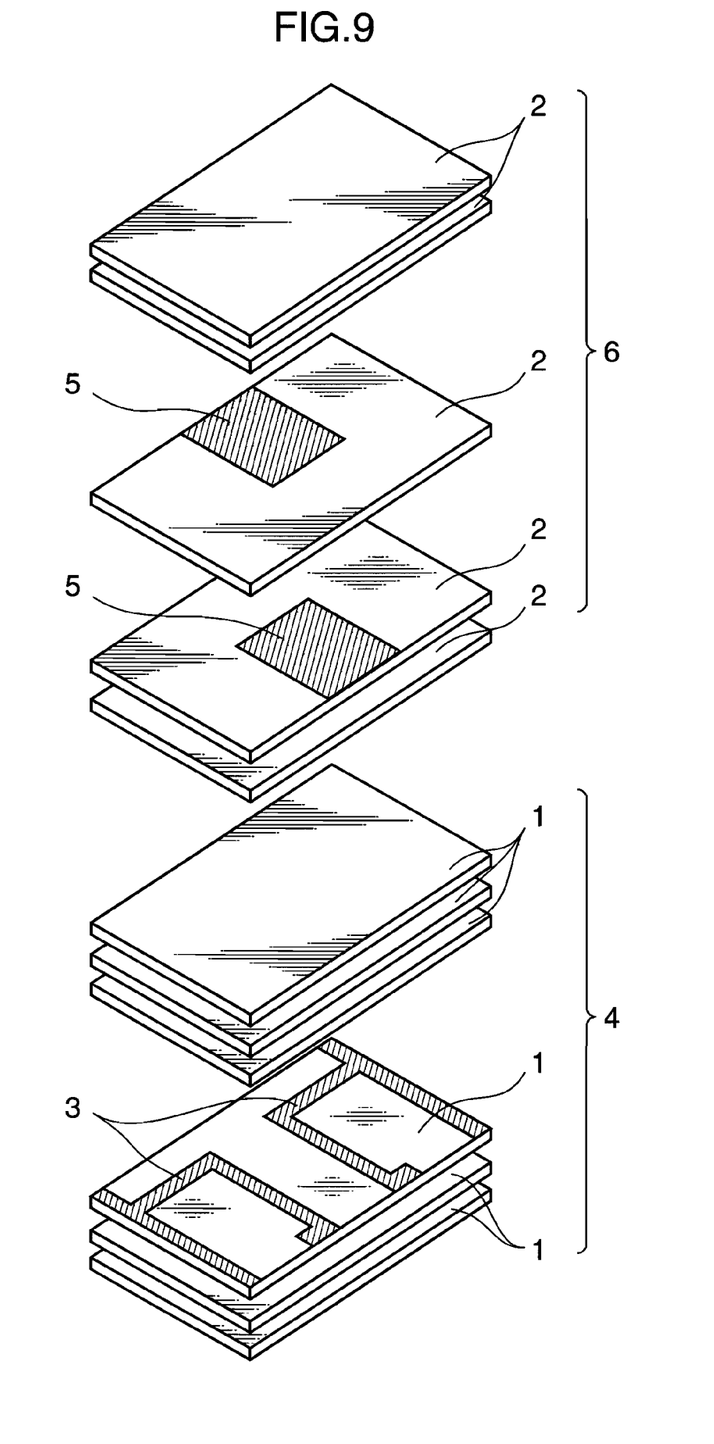
FIG. 9 is an exploded perspective view of a conventional composite electronic device.

A conventional composite electronic device of this type is configured, as shown in FIG. 9, by stacking a plurality of magnetic layers 1 made of a magnetic material and a plurality of varistor layers 2 made of a varistor material. The magnetic layers 1 and a plurality of conductors 3 formed inside of these magnetic layers 1 constitute an inductor 4. Besides, the varistor layers 2 and a plurality of internal conductors 5 formed inside of these varistor layers 2 constitute a varistor portion 6. The inductor 4 functions as a noise filter, and the varistor portion 6 functions as a portion for regulating static electricity which discharges an electrostatic pulse when this electrostatic pulse is applied.

As the prior-art document information related to the present invention, for example, Patent Document 1 is known.

In the conventional composite electronic device, the inductor 4 and the varistor portion 6 are placed one over another. This causes the problem of making harder in thinning the device.

Patent Document 1: Japanese Patent Laid-Open Publication No. 8-250309

DISCLOSURE OF THE INVENTION

In order to solve the problem of the conventional art, it is an object of the present invention to provide a composite electronic device which is thinner and has a portion for regulating static electricity.

In order to accomplish the object, a composite electronic device according to the present invention includes: a plurality of insulating layers; a coil conductor arranged on at least one of the plurality of insulating layers; a drawing conductor arranged on another insulating layer and partially facing the coil conductor, and having one end electrically connected to one end of the coil conductor, the drawing conductor constituting an inductor for passing an external signal in combination with the coil conductor; and an internal conductor formed on one surface of the insulating layer where the coil conductor or the drawing conductor is arranged, and having one end to which static electricity generated in the inductor is discharged and the other end from which the discharged static electricity is released to the ground; and a via electrode for electrically connecting the one end of the coil conductor to the one end of the drawing conductor, a part of the coil conductor or the one end of the drawing conductor and the internal conductor constituting a static electricity regulator for regulating a static electricity.

According to this configuration, the static electricity regulator operable to discharge a static electricity generated in the inductor to the one end of the internal conductor and release it to the ground via the other end of the internal conductor can be formed on one surface of the insulating layer where the inductor is formed. This makes it possible to realize a thinner composite electronic device having a static electricity regulator.

BEST MODE FOR CARRYING OUT THE INVENTION

Embodiments of the present invention will be below described with reference to the drawings.

First Embodiment

Figure 1:
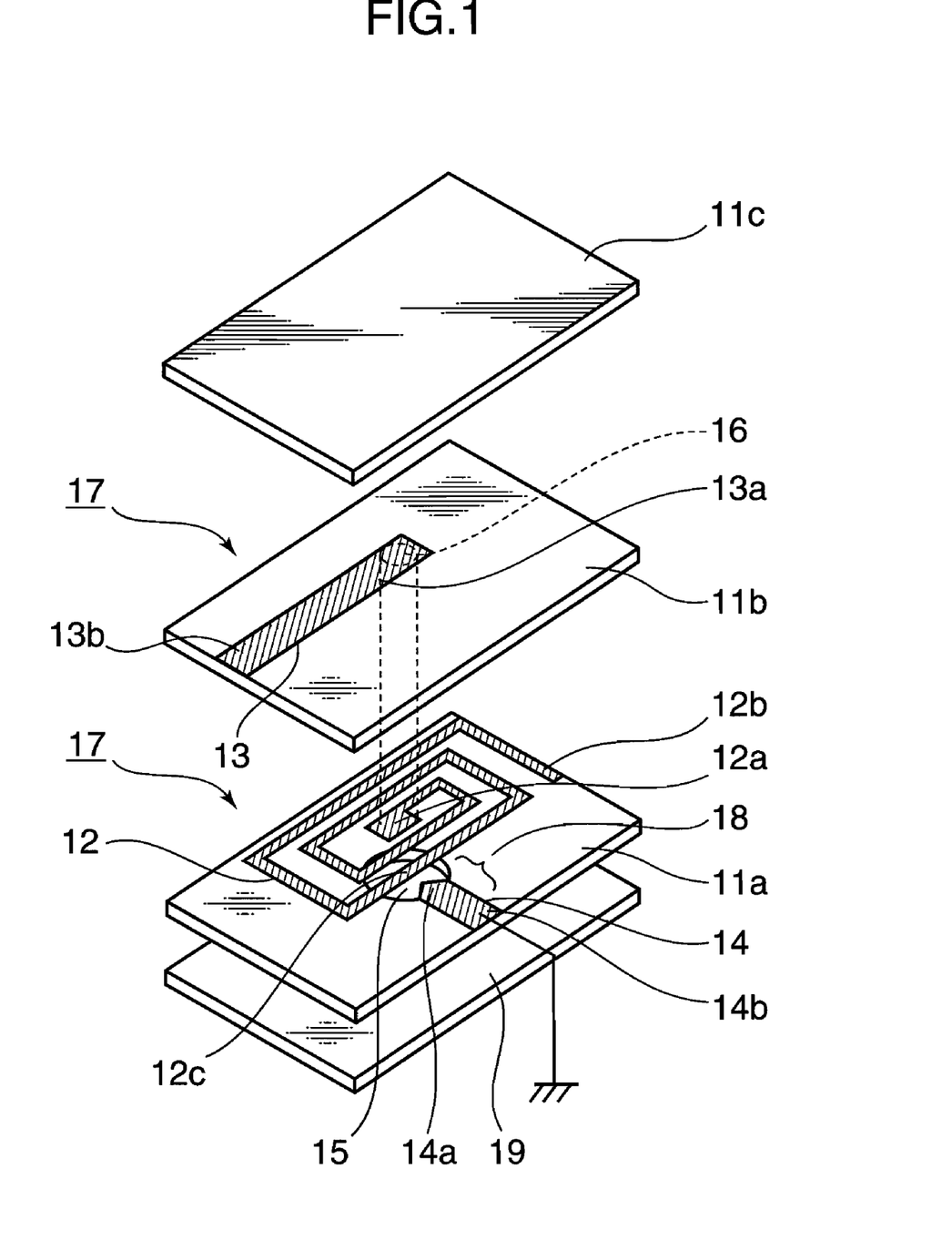
FIG. 1 is an exploded perspective view of a composite electronic device according to a first embodiment of the present invention.

FIG. 1 is an exploded perspective view of a composite electronic device according to a first embodiment of the present invention.

In FIG. 1, the composite electronic device according to the first embodiment comprises a plurality of insulating layers, four insulating layers, specifically, a dummy insulating layer 19; a first insulating layer 11a over the dummy layer; a second insulating layer 11b over the first insulating layer; and a third insulating layer 11c over the second insulating layer. The dummy insulating layer 19, first insulating layer 11a, second insulating layer 11b and third insulating layer 11c are made of an insulating material such as Cu—Zn ferrite, glass, and ceramics. They are formed into a sheet.

On the upper surface of the first insulating layer 11a are formed a coil conductor 12 in the form of a swirl and an internal conductor 14 having one end 14a which is tapered. The one end 14a of the internal conductor 14 is located in the vicinity of a part 12c of the coil conductor 12. Besides, the first insulating layer 11a is formed with a hole 15 in the shape of a circle in a lateral section. The hole 15 is formed at a position where the part 12c of the coil conductor 12 and the one end 14a of the internal conductor 14 come in the circle of the hole 15.

The coil conductor 12 and the internal conductor 14 are formed in the following way. The hole 15 is filled with a burnable material. Thereafter, a base substrate (not shown) is plated with a conductive material such as silver to thereby produce a conductor having the above described shape. Next, the conductor is transferred on the upper surface of the first insulating layer 11a. The four insulating layers 19, 11a, 11b, 11c are stacked. In a burning process, the burnable material filled in the hole 15 is burned away to thereby form the hole 15 as shown in FIG. 1. The burnable material filled in the hole 15 is, for example, a material in which acrylic beads are contained in a resin paste.

The second insulating layer 11b is formed with a via electrode 16 in a position facing one end 12a of the coil conductor 12 formed on the first insulating layer 11a under this. A rectangular drawing conductor 13 is formed over the via electrode 16, and has one end 13a electrically connected to the via electrode 16. When the second insulating layer 11b is placed on the first insulating layer 11a, the one end 12a of the coil conductor 12 is electrically connected to the one end 13a of the drawing conductor 13 through the via electrode 16.

The via electrode 16 is formed by making a via hole in the second insulating layer 11b by means of a laser beam or punching, and embedding a conductive material such as silver in this hole. The drawing conductor 13 is formed in the following way. First, a base substrate (not shown) is plated with a conductive material such as silver to thereby form a rectangular conductor. Next, this conductor is transferred on the upper surface of the second insulating layer 11b.

Herein, the coil conductor 12 and the drawing conductor 13 constitute an inductor 17. The inductor 17 functions as a noise filter which reduces noises superimposing a signal passing between the other end 12b of the coil conductor 12 and the other end 13b of the drawing conductor 13. In addition, the part 12c of the coil conductor 12 and the internal conductor 14 constitute a static electricity regulator 18 for regulating a static electricity. The static electricity regulator 18 has a static-electricity suppressing function of discharging a static electricity generated in the inductor 17 from the part 12c of the coil conductor 12 to the one end 14a of the internal conductor 14 and releasing it via the other end 14b of the internal conductor 14 to the ground.

Figure 2:
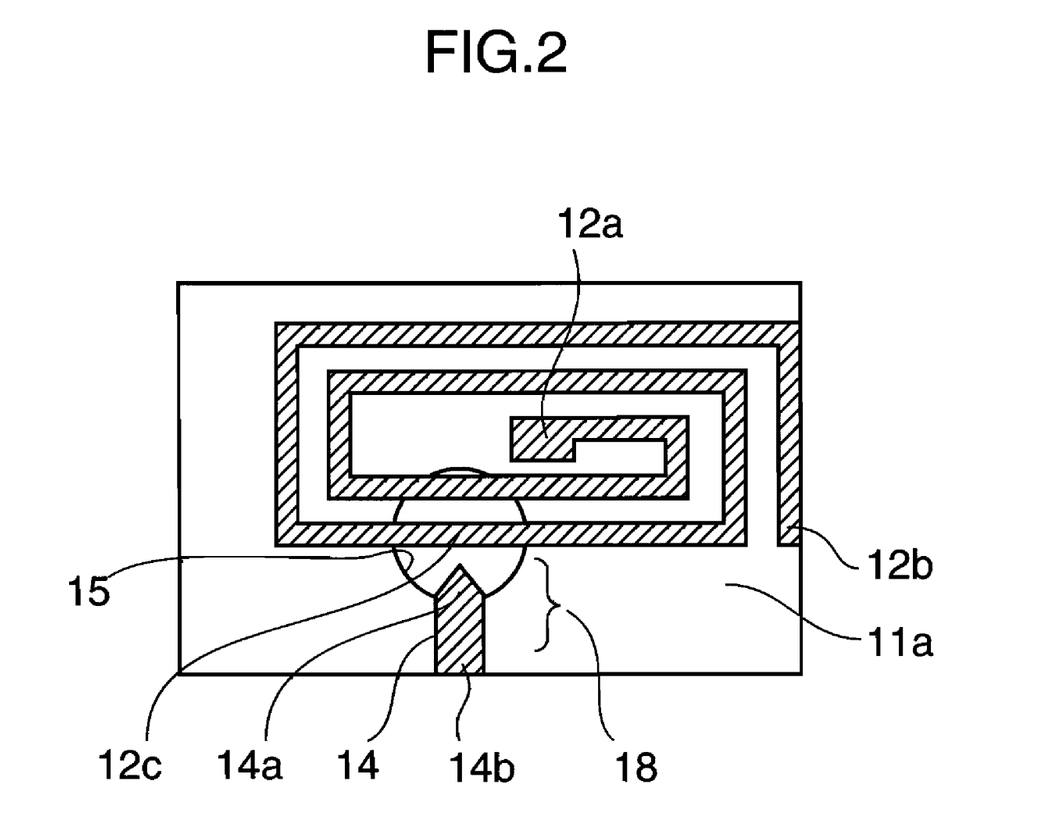
FIG. 2 is a plan view showing a positional relationship between a coil conductor and an internal conductor formed on an upper surface of a first insulating layer, and a hole formed in the first insulating layer in the composite electronic device according to the first embodiment of the present invention.

FIG. 2 is a plan view of the coil conductor 12 and the internal conductor 14 formed on the upper surface of the first insulating layer 11a and the hole 15 in the composite electronic device according to the first embodiment of the present invention, showing their positional relationship. As shown in FIG. 2, the part 12c of the coil conductor 12 and the one end 14a of the internal conductor 14 which constitute the static electricity regulator 18 are located in the circle of the hole 15. It should be noted that even if the hole 15 is not provided, static electricity can be discharged between the part 12c of the coil conductor 12 and the one end 14a of the internal conductor 14. However, the provision of the hole 15 make a space between the part 12c of the coil conductor 12 and the one end 14a of the internal conductor 14, thereby causing static electricity to discharge more easily than without any such hole 15.

The hole 15 may be a recess, a concave, or the like. Taking the operability into account, however, it is preferable to form a through hole in the first insulating layer 11a.

Figure 3:
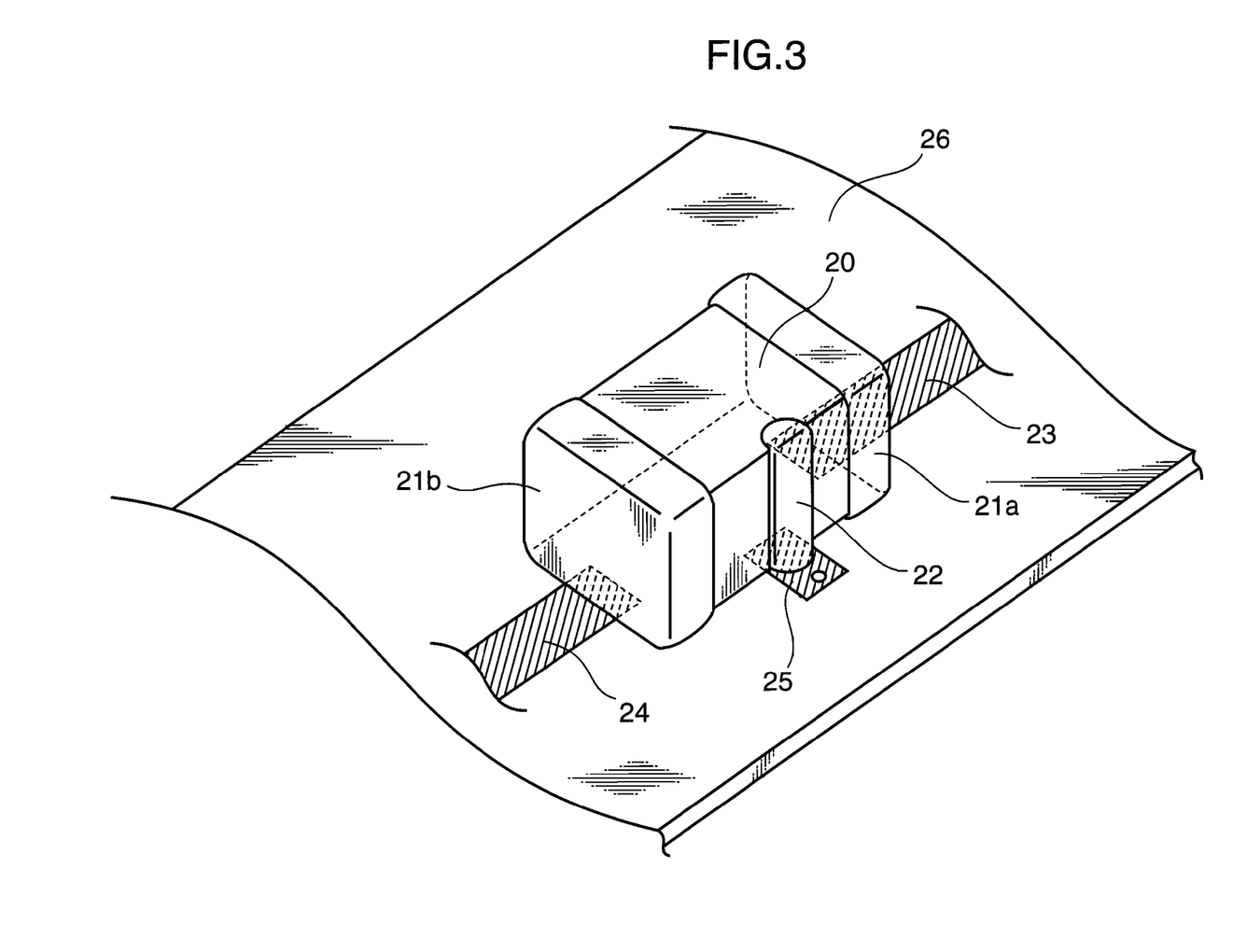
FIG. 3 is a perspective view showing an external appearance of the composite electronic device according to the first embodiment of the present invention mounted on a wiring substrate.

FIG. 3 is a perspective view showing an external appearance of the composite electronic device according to the first embodiment of the present invention mounted on a wiring substrate. First, the dummy insulating layer 19, the first insulating layer 11a, the second insulating layer 11b and the third insulating layer 11c shown in FIG. 1 are stacked in this order. Thereafter, this stack body is burned at a predetermined temperature for a predetermined time, thereby producing a device body 20 shown in FIG. 3. On one end surface and the other end surface of the device body 20, which are opposite to each other in the longitudinal direction, a first external electrode 21a electrically connected to the other end 12b of the coil conductor 12 shown in FIG. 1 and a second external electrode 21b electrically connected to the other end 13b of the drawing conductor 13 shown in FIG. 1 are respectively provided. Besides, on one side of the device body 20, a third external electrode 22 is provided, which is electrically connected to the other end 14b of the internal conductor 14 shown in FIG. 1.

The first external electrode 21a, the second external electrode 21b and the third external electrode 22 are formed by applying a conductive material such as silver, and then coating a nickel layer and a tin layer.

The thus produced composite electronic device is mounted on a wiring substrate 26 by connecting the first external electrode 21a to an input signal line 23 by solder or the like, and connecting the second external electrode 21b to an output signal line 24 by solder or the like, and connecting the third external electrode 22 to a ground line 25 by solder or the like.

A signal containing noises comes from the input signal line 23 into the first external electrode 21a where the noises are then reduced by the inductor 17 (see FIG. 1) formed inside of the device body 20, and is outputted from the second external electrode 21b to the output signal line 24. Besides, if an electrostatic voltage exceeding a specified voltage is applied to the input signal line 23, the static electricity is discharged by the static electricity regulator 18 (see FIG. 1) formed inside of the device body 20. Specifically, the static electricity is discharged to the one end 14a of the internal conductor 14 from the part 12c of the coil conductor 12 which constitutes a part of the inductor 17, and then is released to the ground via the other end 14b of the internal conductor 14 and the third external electrode 22. This protects elements or the like which are connected to the output signal line 24.

As described above, in the first embodiment, the static electricity regulator 18 which discharges the static electricity generated in the inductor 17 to the one end 14a of the internal conductor 14 from the part 12c of the coil conductor 12, and releases it to the ground via the other end 14b of the internal conductor 14 can be formed on one surface of the first insulating layer 11a where the inductor 17 is formed. This makes it possible to realize the thinner composite electronic device provided with the static electricity regulator 18.

In this embodiment, the hole 15 is provided. In the case where no such hole 15 is provided, the first insulating layer 11a and the second insulating layer 11b sandwiching the coil conductor 12 and the internal conductor 14 may be made of a glass material. In this construction, even if a part of the coil conductor 12 and/or the internal conductor 14 is melted when static electricity is discharged, molten conductor material pieces can be prevented from dispersing and remaining in static electricity regulator 18, thus keeping the insulating resistance.

Furthermore, in this embodiment, the first insulating layer 11a where the coil conductor 12 is formed and the second insulating layer 11b where the drawing conductor 13 is formed are both made of a magnetic material. This increases the inductance of the inductor 17 constituted by the coil conductor 12 and the drawing conductor 13. Alternatively, the first insulating layer 11a and the second insulating layer 11b may be made of a dielectric material to reduce the stray capacitance between coil conductors 12 so that the inductor 17 can eliminate high frequency noises.

Moreover, in this embodiment, the swirl-shaped coil conductor and the rectangular drawing conductor constitute the inductor. However, the present invention is not limited to this construction.

For example, it may be appreciated that a first insulating layer 11a where a coil conductor 12 is formed and a second insulating layer 11b where a drawing conductor 13 is formed are made of a magnetic material, and the coil conductor 12 is zigzagged in widthwise directions of the first insulating layer 11a while advancing in a longitudinal direction and electrically connected to an one end 13a of the drawing conductor 13, the drawing conductor 13 is zigzagged in longitudinal directions of the second insulating layer 11b while advancing in a widthwise direction and partially facing the coil conductor 12, in other words, those conductors having a zigzag shape.

Alternatively, it may be appreciated that a first insulating layer 11a where a coil conductor 12 is formed and a second insulating layer 11b where a drawing conductor 13 is formed are made of a magnetic material, and the coil conductor 12 extends in a longitudinal direction of the first insulating layer 11a, and turns and extends in a widthwise direction, and turns and extends in the reverse longitudinal direction, and turns and extends in the reverse widthwise direction, and electrically connected to an one end 13a of the drawing conductor 13, and the drawing conductor 13 extends in a longitudinal direction of the second insulating layer 11b, and turns and extends in a widthwise direction, and turns and extends in the reverse longitudinal direction, and turns and extends in the reverse widthwise direction, in other words, those conductors having a helical shape.

In this embodiment, the coil conductor 12 and the internal conductor 14 are formed on the upper surface of the first insulating layer 11a. However, they may be formed on the lower surface of the second insulating layer 11b.

Second Embodiment

Figure 4:
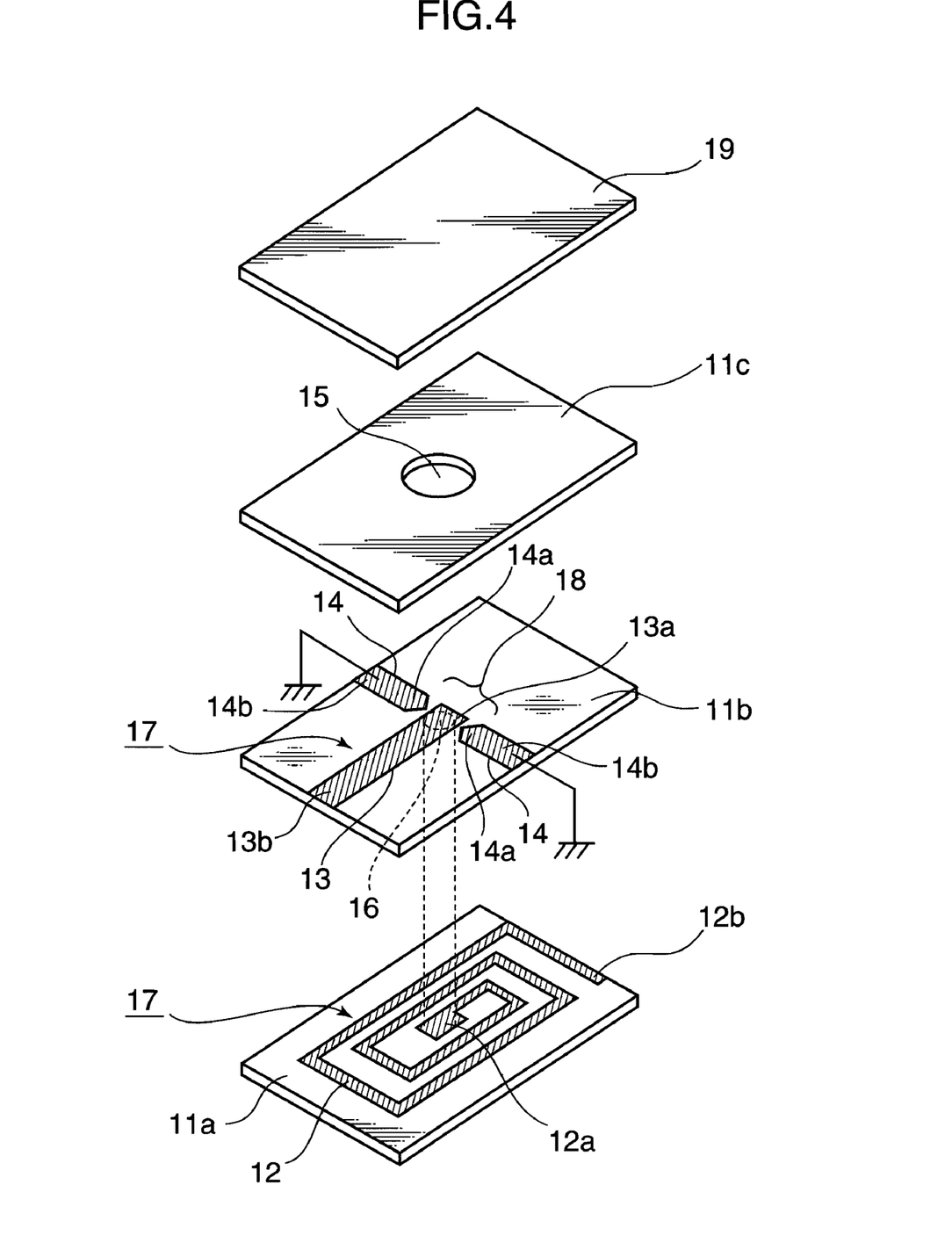
FIG. 4 is an exploded perspective view of a composite electronic device according to a second embodiment of the present invention.

FIG. 4 is an exploded perspective view of a composite electronic device according to a second embodiment of the present invention. In FIG. 4, component elements are given the same reference characters and numerals as those shown in FIG. 1 referred to in the description of the first embodiment, as long as the former are identical to the latter. Thus, their detailed description is omitted.

In FIG. 4, the composite electronic device according to the second embodiment is different from that according to the first embodiment in the following respect. Only a coil conductor 12 is formed on a first insulating layer 11a. Two internal conductors 14, 14 are formed in such a way that tapered ends 14a, 14a face each other via one ends 13a of a drawing conductor 13 formed on a second insulating layer 11b, and they come close to the one end 13a. Besides, a hole 15 is formed in a third insulating layer 11c. These differences are mainly described below.

In the second embodiment, the one end 13a of the drawing conductor 13 and the one ends 14a, 14a of the two internal conductors 14, 14 constitute a static electricity regulator 18. The static electricity regulator 18 is formed only on the upper surface of the second insulating layer 11b. If an electrostatic voltage is applied to an inductor 17 made up of the coil conductor 12 and the drawing conductor 13, the static electricity is discharged from the one end 13a of the drawing conductor 13 to either or both of the one ends 14a, 14a of the two internal conductors 14, 14, and is then released to the ground through either or both of the other ends 14b, 14b of the two internal conductors 14, 14.

Furthermore, in the second embodiment, a hole 15 having a circle-shape in a lateral section is not formed together with the coil conductor 12 and the internal conductor 14 in the first insulating layer 11a as is the case with the first embodiment. Only the hole 15 is formed in the third insulating layer 11c in such a way that the one end 13a of the drawing conductor 13 and the one ends 14a, 14a of the two internal conductors 14, 14 formed on the second insulating layer 11b come in the circle of the hole 15 when those layers are stacked. This is because the hole 15 cannot be formed in the second insulating layer 11b where a via electrode 16 is formed.

The hole 15 is filled with a voltage-dependent material having a voltage/current non-linear characteristic. Accordingly, if a static electricity generated in the inductor 17 exceeds a predetermined voltage, the static electricity is discharged to either or both of the one ends 14a, 14a of the internal conductors 14, 14, and is released to the ground through either or both of the other ends 14b, 14b of the internal conductors 14, 14. This makes it possible to obtain a stable static-electricity suppressing function. In addition, as the voltage-dependent material, a varistor material such as a ceramic material is used which has zinc oxide as its principal component. If the static electricity exceeding the predetermined voltage is applied, the static electricity can be more efficiently kept back. At the same time, if the static electricity is equal to or below the predetermined voltage, the insulation between the drawing conductor 13 and the internal conductors 14, 14 can be secured.

The hole 15 may be formed into a recess, a concave or the like. Taking the operability into account, however, it is preferably formed through the third insulating layer 11c.

Figure 5:
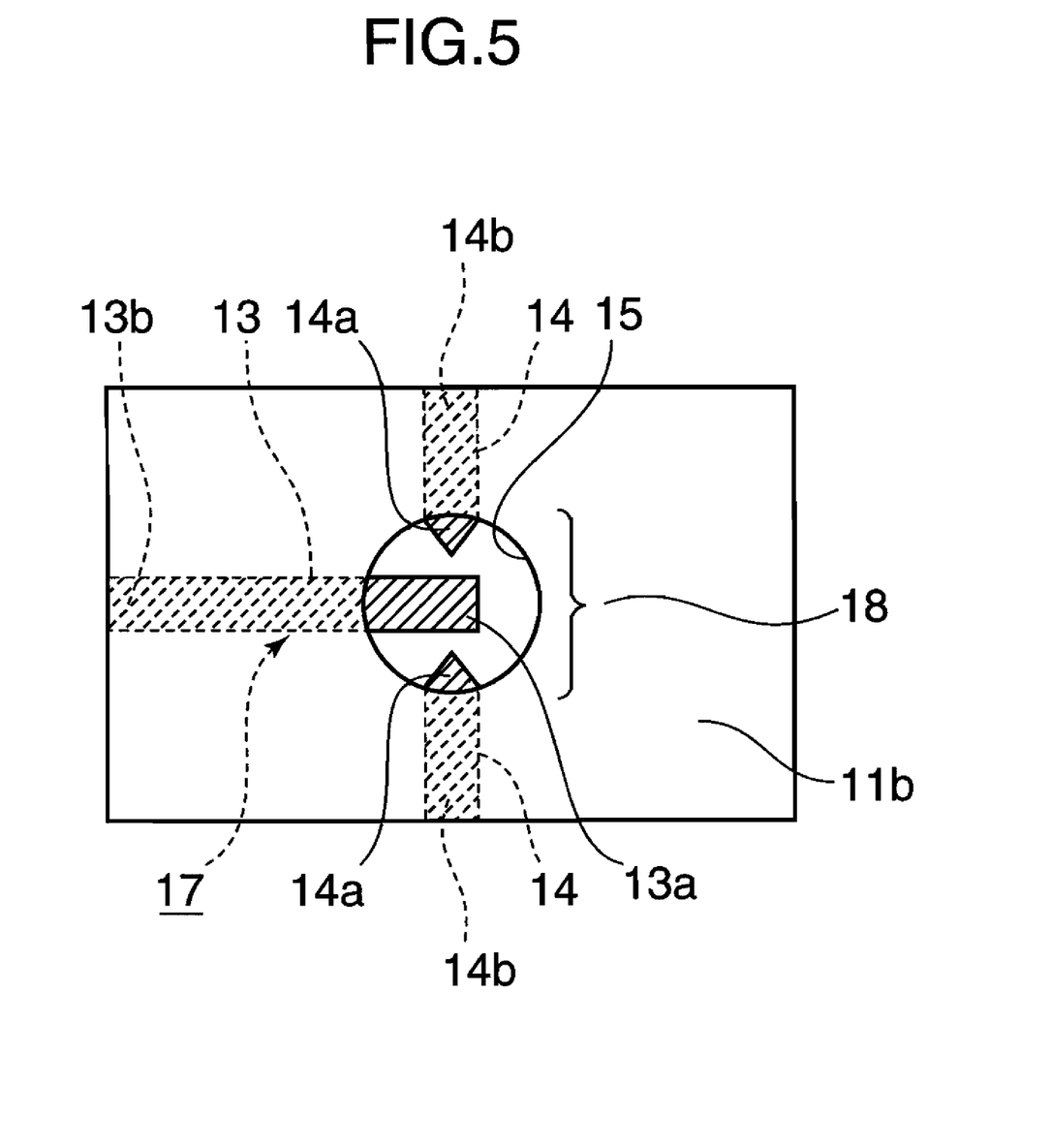
FIG. 5 is a plan view showing a positional relationship between a drawing conductor and an internal conductor formed on an upper surface of a second insulating layer and a hole formed in a third insulating layer in the composite electronic device according to the second embodiment of the present invention.

FIG. 5 is a plan view of the drawing conductor 13 and the internal conductor 14 formed on the upper surface of the second insulating layer 11b and the hole 15 formed in the third insulating layer 11c in the composite electronic device according to the second embodiment of the present invention, showing their positional relationship. As shown in FIG. 5, the one end 13a of the drawing conductor 13 and the one ends 14a, 14a of the two internal conductors 14, 14 which constitute the static electricity regulator 18 are adjacent to each other and are located in the circle of the hole 15 formed in the third insulating layer 11c.

Figure 6:
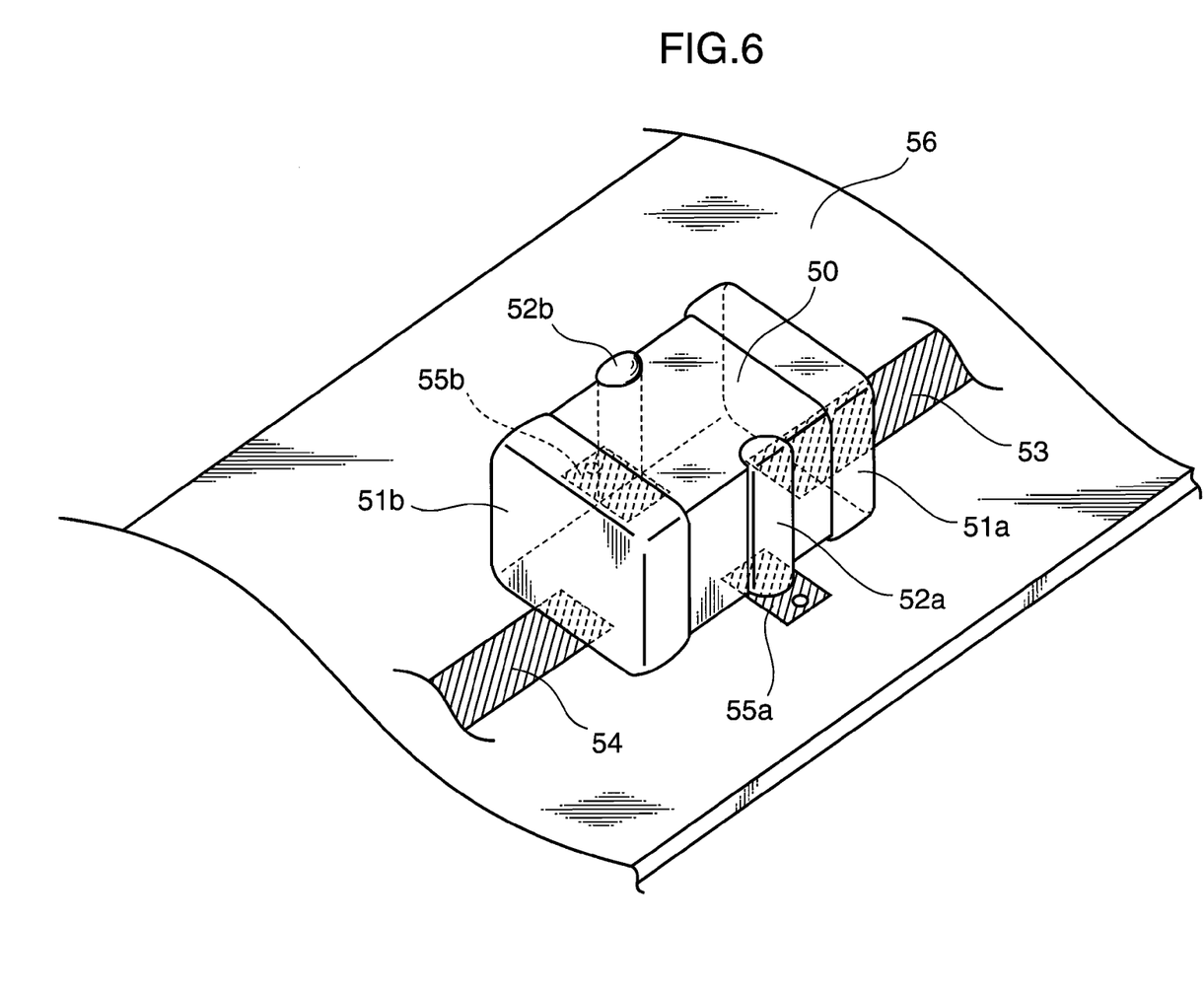
FIG. 6 is a perspective view showing an external appearance of the composite electronic device according to the second embodiment of the present invention mounted on a wiring substrate.

FIG. 6 is a perspective view showing an external appearance of the composite electronic device according to the second embodiment of the present invention mounted on a wiring substrate. First, the first insulating layer 11a, the second insulating layer 11b, the third insulating layer 11c and a dummy insulating layer 19 shown in FIG. 4 are stacked in this order. Thereafter, this stack body is burned at a predetermined temperature for a predetermined period to thereby produce a device body 50 shown in FIG. 6. On one end surface and the other end surface of the device body 50 which are opposite to each other in the longitudinal direction, a first external electrode 51a electrically connected to the other end 12b of the coil conductor 12 shown in FIG. 4 and a second external electrode 51b electrically connected to the other end 13b of the drawing conductor 13 shown in FIG. 4 are formed, respectively. Besides, on one side and the other side of the device body 50, third external electrodes 52a, 52b which are electrically connected to the other ends 14b, 14b of the two internal conductors 14, 14 shown in FIG. 4 are formed, respectively.

The thus produced composite electronic device is mounted on a wiring substrate 56 by connecting the first external electrode 51a to an input signal line 53 by solder or the like, and the second external electrode 51b to an output signal line 54 by solder or the like, and the two third external electrodes 52a, 52b to ground lines 55a, 55b by solder or the like, respectively.

In this second embodiment, on one side and the other side of the device body 50 are provided the two third external electrodes 52a, 52b which are electrically connected to the two ground lines 55a, 55b, respectively. Hence, there is no need to consider which direction the composite electronic device should be oriented toward when it is mounted, compared with the configuration according to the first embodiment where the third external electrode 22 is provided only on one side of the device body. Specifically, when the composite electronic device is mounted on the wiring substrate 56, it may be implemented at either zero or 180 degrees with the signal lines 53, 54.

When a signal containing noises comes into the first external electrode 51a from the input signal line 53, these noises are reduced by the inductor 17 (see FIG. 4) formed inside of the device body 50, and then outputted from the second external electrode 51b to the output signal line 54. Besides, if an electrostatic voltage exceeding a predetermined voltage is applied to the input signal line 53, the static electricity regulator 18 (see FIG. 4) formed inside of the device body 50 allows the static electricity to discharge to either or both of the one ends 14a, 14a of the two internal conductors 14, 14 from the one end 13a of the drawing conductor 13 which constitutes a part of the inductor 17, and to release to either or both of the two ground lines 55a, 55b through either or both of the other ends 14b, 14b of the two internal conductors 14, 14 and either or both of the two third external electrodes 52a, 52b. This protects elements or the like which is connected to the output signal line 54.

As described above, in this second embodiment, the static electricity regulator 18 which allows the static electricity generated in the inductor 17 discharge to the one end 14a of at least one such internal conductor 14 from the one end 13a of the drawing conductor 13, and to release to the ground via the other end 14b of at least one such internal conductor 14 can be formed on one surface of the second insulating layer 11b. This makes it possible to realize the thinner composite electronic device provided with the static electricity regulator 18.

Third Embodiment

Figure 7:
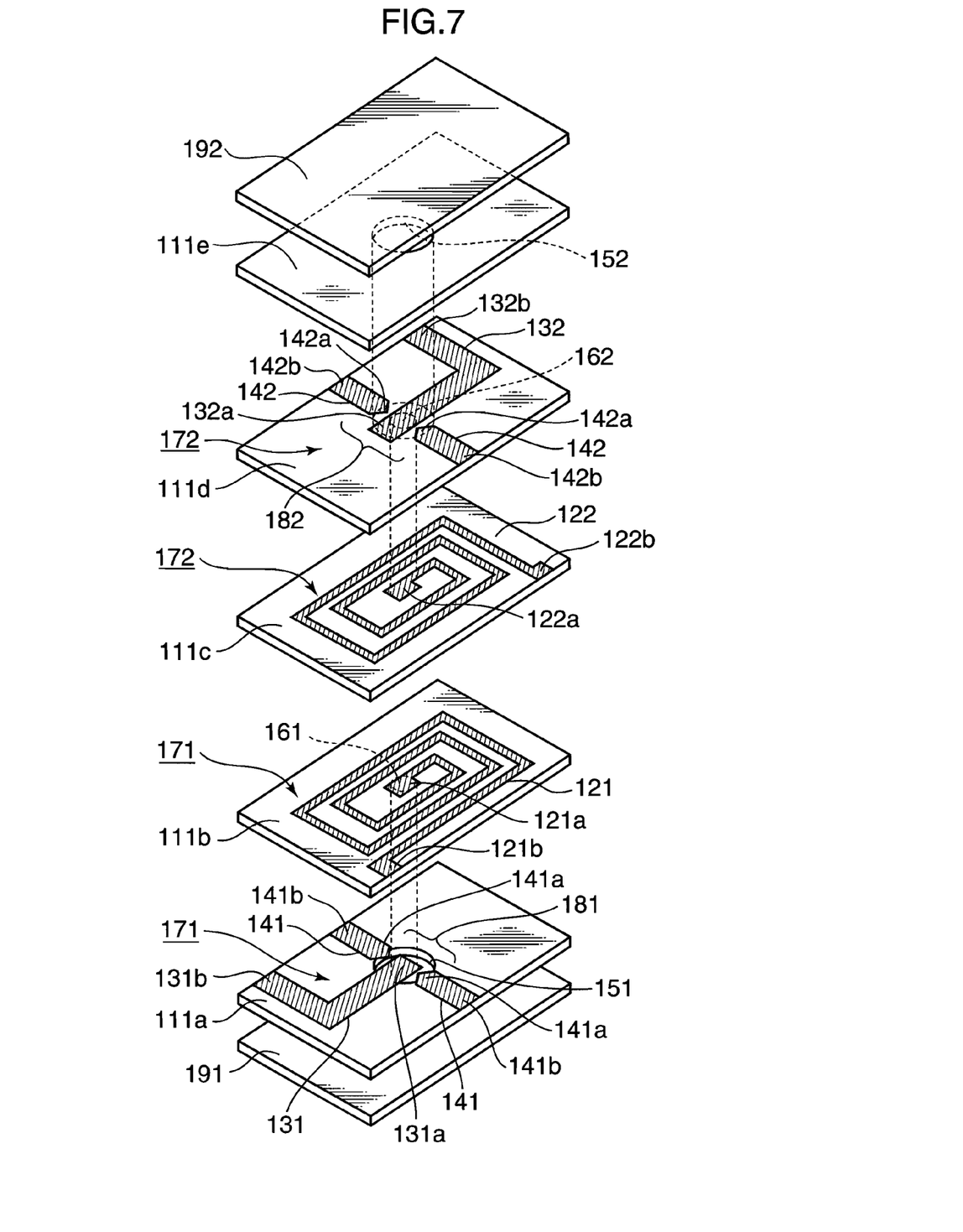
FIG. 7 is an exploded perspective view of a composite electronic device according to a third embodiment of the present invention.

FIG. 7 is an exploded perspective view of a composite electronic device according to a third embodiment of the present invention. In FIG. 7, component elements are given the same reference characters and numerals as those shown in FIG. 4 referred to in the description of the second embodiment, as long as the former are identical to the latter. Thus, their detailed description is omitted.

In FIG. 7, the composite electronic device according to the third embodiment is configured by seven insulating layers as the plurality of insulating layers, specifically, a first dummy insulating layer 191; a first insulating layer 111a over the first dummy insulating layer; a second insulating layer 111b over the first insulating layer; a third insulating layer 111c over the second insulating layer; a fourth insulating layer 111d over the third insulating layer; a fifth insulating layer 111e over the fourth insulating layer; and a second dummy insulating layer 192. The first dummy insulating layer 191, first insulating layer 111a, second insulating layer 111b, third insulating layer 111c, fourth insulating layer 111d, fifth insulating layer 111e and second dummy insulating layer 192 are made of an insulating material such as Cu—Zn ferrite, glass, and ceramics. They are formed into a sheet.

On the upper surface of the first insulating layer 111a are formed an L-shaped first drawing conductor 131 and two first internal conductors 141, 141 having tapered ends 141a, 141a in such a way that the one ends 141a, 141a of the two first internal conductors 141, 141 face each other via one end 131a of the first drawing conductor 131 and come close to the one end 131a. Besides, in the first insulating layer 111a, a first hole 151 having a circular shape in the lateral section is formed. The first hole 151 is formed in such a position that the one end 131a of the first drawing conductor 131 and the one ends 141a, 141a of the two first internal conductors 141, 141 come in the circle of the first hole 151.

The first drawing conductor 131 and the two first internal conductors 141, 141 are formed in the following way. The first hole 151 is filled with a burnable material. Thereafter, a base substrate (not shown) is plated with a conductive material such as silver to thereby produce conductors having the above described shapes. Next, these conductors are transferred on the upper surface of the first insulating layer 111a. The seven insulating layers 191, 111a, 111b, 111c, 111e and 192 are piled, the burnable material filled into the first hole 151 is burned away in the burning process to thereby form the first hole 151 as shown in FIG. 7. The burnable material filled in the first hole 151 is, for example, a material such as resin paste containing acrylic beads.

On the second insulating layer 111b, a first via electrode 161 is formed in a position facing the one end 131a of the first drawing conductor 131 formed on the first insulating layer 111a under the second insulating layer. Over the first via electrode 161, a first coil conductor 121 is formed, which has one end 121a electrically connected to the first via electrode 161. When the second insulating layer 111b is piled on the first insulating layer 111a, the one end 121a of the first coil conductor 121 is electrically connected through the first via electrode 161 to the one end 131a of the first drawing conductor 131.

The via electrode 161 is formed by making a via hole in the second insulating layer 111b by means of a laser beam or punching, and embedding a conductive material such as silver in this hole. The first coil conductor 121 is formed in the following way. A base substrate (not shown) is plated with a conductive material such as silver to thereby form a coil conductor. Next, this conductor is transferred onto the upper surface of the second insulating layer 111b.

The first coil conductor 121 and the first drawing conductor 131 constitute a first inductor 171. The first inductor 171 functions as a first noise filter which reduces noises superimposing a signal passing between the other end 121b of the first coil conductor 121 and the other end 131b of the first drawing conductor 131. In addition, the one end 131a of the first drawing conductor 131 and the two first internal conductors 141, 141 constitute a first static electricity regulator 181. The first static electricity regulator 181 has a static-electricity regulation function of discharging static electricity generated in the first inductor 171 from the one end 131a of the first drawing conductor 131 to either or both of the one ends 141a, 141a of the two first internal conductors 141, 141 and releasing it to the ground via either or both of the other ends 141b, 141b of the two first internal conductors 141, 141.

On the upper surface of the third insulating layer 111c is formed a second coil conductor 122. For forming of the second coil conductor 122, the same material and method are used as those of the above described first coil conductor 121.

On the fourth insulating layer 111d is formed a second via electrode 162 in a position facing one end 122a of the second coil conductor 122 formed on the third insulating layer 111c under the fourth insulating layer. Over the second via electrode 162, an L-shaped second drawing conductor 132 is formed, which has one end 132a electrically connected to the second via electrode 162. When the fourth insulating layer 111d is piled on the third insulating layer 111c, the one end 122a of the second coil conductor 122 is electrically connected through the second via electrode 162 to the one end 132a of the second drawing conductor 132.

In addition, on the upper surface of the fourth insulating layer 114d are formed two second internal conductors 142, 142 having one ends 142a, 142a which are tapered, in such a way that the one ends 142a, 142a face each other via the one end 132a of the second drawing conductor 132 and come close to the one end 132a.

For forming of the second drawing conductor 132 and the two second internal conductors 142, 142, the same material and method are used as those of the above described first drawing conductor 131 and two first internal conductors 141, 141, respectively.

The second coil conductor 122 and the second drawing conductor 132 constitute a second inductor 172. The second inductor 172 functions as a second noise filter which reduces noises superimposing a signal passing between the other end 122b of the second coil conductor 122 and the other end 132b of the second drawing conductor 132. In addition, the one end 132a of the second drawing conductor 132 and the two second internal conductors 142, 142 constitute a second static electricity regulator 182. The second static electricity regulator 182 has a static-electricity regulation function of discharging a static electricity generated in the second inductor 172 from the one end 132a of the second drawing conductor 132 to either or both of the one ends 142a, 142a of the two second internal conductors 142, 142 and releasing it to the ground via either or both of the other ends 142b, 142b of the two second internal conductors 142, 142.

The fifth insulating layer 111e is formed with a second hole 152 having a circular cross section in such a way that the one end 132a of the second drawing conductor 132 and the one ends 142a, 142a of the two second internal conductors 142, 142 formed on the fourth insulating layer 111d come in the circle of the second hole 152 when they are piled.

Figure 8:
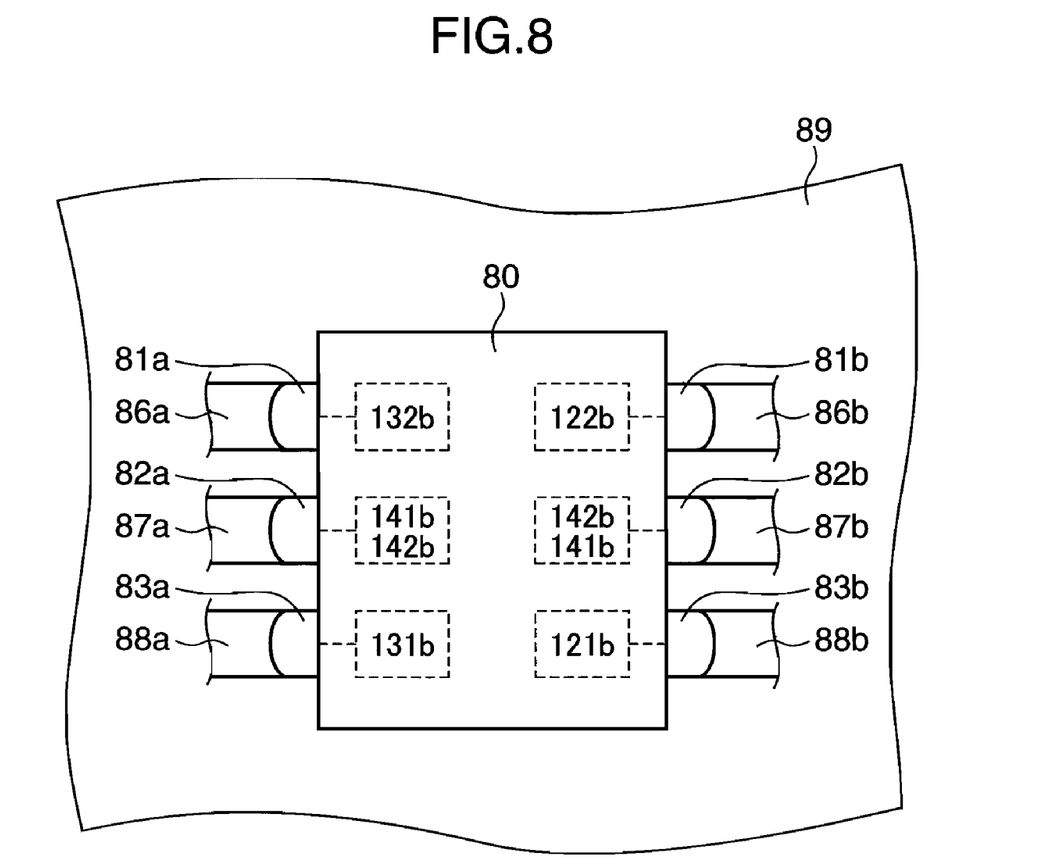
FIG. 8 is a top plan view of the composite electronic device according to the third embodiment of the present invention mounted on a wiring substrate.

FIG. 8 is a top plan view of the composite electronic device mounted on a wiring substrate according to the third embodiment of the present invention. The first dummy insulating layer 191, first insulating layer 111a, second insulating layer 111b, third insulating layer 111c, fourth insulating layer 111d, fifth insulating layer 111e and second dummy insulating layer 192, as shown in FIG. 7, are stacked in this order. Thereafter, this stack body is burned at a predetermined temperature for a predetermined period to thereby produce a device body 80 shown in FIG. 8.

On longitudinally one side of the device body 80 are formed three external electrodes 81a, 82a, and 83a. The external electrode 81a is electrically connected, as shown in FIG. 7, to the other end 132b of the second drawing conductor 132; the external electrode 82a is electrically connected to the other end 141b of the first internal conductor 141 and the other end 142b of the second internal conductor 142; and the external electrode 83a is electrically connected to the other end 131b of the first drawing conductor 131.

In addition, on longitudinally the other side of the device body 80 are formed three external electrodes 81b, 82b, and 83b. The external electrode 81b is electrically connected, as shown in FIG. 7, to the other end 122b of the second coil conductor 122; the external electrode 82b is electrically connected to and the other end 142b of the second internal conductor 142 and the other end 141b of the first internal conductor 141; and the external electrode 83b is electrically connected to the other end 121b of the first coil conductor 121.

Hence, the other end 132b of the second drawing conductor 132, the other end 141b of the first internal conductor 141, the other end 142b of the second internal conductor 142 and the other end 131b of the first drawing conductor 131, as well as the other end 122b of the second coil conductor 122, the other end 142b of the second internal conductor 142, the other end 141b of the first internal conductor 141 and the other end 121b of the first coil conductor 121 are drawn out to the two opposite sides of the device body 80 of the composite electronic device. Simultaneously, the number of the ends which are drawn out to each opposite side is the same. Besides, if the other end 131b of the first drawing conductor 131 and the other end 132b of the second drawing conductor 132 which are connected to the first coil conductor 121 and the second coil conductor 122, respectively, are drawn out to the side different from the side where the other end 121b of the first coil conductor 121 and the other end 122b of the second coil conductor 122 are drawn out, then the composite electronic device can be easily used for a plurality of parallel signal lines 86a, 87a, 88a, 86b, 87b, 88b on a wiring substrate 89.

The position and number of external electrodes are not limited to the external electrodes 81a, 82a, 83a and the external electrodes 81b, 82b, 83b as described above, and may be varied. For example, the external electrodes 81a, 82a, 83a and the external electrodes 81b, 82b, 83b may be formed on laterally two opposite sides. Alternatively, the other end 131b of the first drawing conductor 131 and the other end 132b of the second drawing conductor 132 may be connected to the same external electrode.

As described above, this composite electronic device according to the third embodiment includes the section including the first inductor 171 and the first static electricity regulator 181 as well as the section including the second inductor 172 and the second static electricity regulator 182.

Therefore, the third insulating layer 111c is made of a magnetic material which is sandwiched between the first coil conductor 121 which constitutes a part of the first inductor 171 and the second coil conductor 122 which constitutes a part of the second inductor 172. Thereby, the first coil conductor 121 and the second coil conductor 122 can be coupled together by means of magnetism. This makes it possible to form a common-mode noise filter or a multilayered transformer which includes the first inductor 171 and the second inductor 172.

Furthermore, the third insulating layer 111c sandwiched between the first coil conductor 121 which constitutes a part of the first inductor and the second coil conductor 122 which constitutes a part of the second inductor is designed to have a lower magnetic permeability than the other insulating layers 111a, 111b, 111d, 111e, thus preventing a magnetic flux generated in the first coil conductor 121 and the second coil conductor 122 from leaking out. This helps strengthen the magnetic coupling between the first coil conductor 121 and the second coil conductor 122.

Moreover, the third insulating layer 111c sandwiched between the first coil conductor 121 which constitutes a part of the first inductor and the second coil conductor 122 which constitutes a part of the second inductor is designed to have a lower permittivity than the other insulating layers 111a, 111b, 111d, 111e, thus reducing the stray capacitance between the first coil conductor 121 and the second coil conductor 122. This helps form a noise filter which is capable of further eliminating a high frequency band noise.

In each embodiment described so far, the coil conductors, drawing conductors and internal conductors are formed by plating, but may be formed by other methods such as printing and evaporative deposition.

The characteristic configurations of the present invention can be summed up as below.

A composite electronic device according to the present invention comprises: a plurality of insulating layers; a coil conductor arranged on at least one of the plurality of insulating layers; a drawing conductor arranged on another insulating layer and partially opposing the coil conductor, and having one end electrically connected to one end of the coil conductor so as to constitute an inductor in combination with the coil conductor for passing an external signal; and an internal conductor having one end which is formed on one surface of the insulating layer where the coil conductor or the drawing conductor is arranged and to which static electricity generated in the inductor is discharged, and the other end from which the discharged static electricity is released to the ground, a part of the coil conductor or the one end of the drawing conductor and the internal conductor constituting a static electricity regulator.

According to this configuration, the static electricity regulator which allows the static electricity generated in the inductor to discharge to the one end of the internal conductor from the part of the coil conductor or the one end of the drawing conductor, and release it to the ground via the other end of the internal conductor can be formed on one surface of the insulating layer where the inductor is formed. This makes it possible to realize a thinner composite electronic device provided with the static electricity regulator.

In the composite electronic device according to the present invention, it is preferable that the internal conductor have one end formed in the vicinity of a part of the coil conductor on one surface of the insulating layer where the coil conductor is arranged.

According to this configuration, the static electricity regulator which allows the static electricity generated in the inductor to discharge to the one end of the internal conductor from the part of the coil conductor, and release it to the ground via the other end of the internal conductor can be formed on one surface of the insulating layer where the inductor is formed. This makes it possible to realize a thinner composite electronic device having the static electricity regulator.

In the composite electronic device according to the present invention, it is preferable that the internal conductor have one end formed in the vicinity of a part of the drawing conductor on one surface of the insulating layer where the drawing conductor is arranged.

According to this configuration, the static electricity regulator which allows the static electricity generated in the inductor discharge to the one end of the internal conductor from the one end of the drawing conductor, and release it to the ground via the other end of the internal conductor can be formed on one surface of the insulating layers where the inductor is formed. This makes it possible to realize a thinner composite electronic device having the static electricity regulator.

In the composite electronic device according to the present invention, preferably, a plurality of internal conductors may be formed.

According to this configuration, the static electricity can be released in both directions from the other ends of the plurality of internal conductors. This can eliminate the mount directionality.

In the composite electronic device according to the present invention, it is preferable that the one end of the internal conductor be tapered.

According to this configuration, when an electrostatic voltage is applied, a current intensity can be increased in the one end of the internal conductor. This facilitates a discharge to the one end of the internal conductor from the part of the coil conductor or the one end of the drawing conductor.

In the composite electronic device according to the present invention, preferably, among the plurality of insulating layers, the insulating layers sandwiching the coil conductor may be made of a magnetic material or a dielectric material.

According to this configuration, the inductance of the inductor including the coil conductor 12 is increased and the stray capacitance between the coil conductors is reduced. This makes it possible to get rid of high frequency noises.

In the composite electronic device according to the present invention, it is preferable that the insulating layers sandwiching the internal conductor are made of a glass material.

According to this configuration, even if a part of the internal conductor is melted when static electricity is discharged, molten conductor material pieces can be prevented from scattering and remaining in the static electricity regulator, thus helping keep the insulation resistance.

In the composite electronic device according to the present invention, preferably: the insulating layer having the internal conductor and/or the insulating layer directly over the insulating layer may be formed with a hole. The hole may be at a position where at least the one end of the internal conductor comes in the hole.

According to this configuration, the provision of the hole makes a space between the one end of the drawing conductor and the one end of the internal conductor. Therefore, the static electricity can be more easily discharged than without any such hole.

In the composite electronic device according to the present invention, the hole may be a through hole in the insulating layer.

According to this configuration, the hole can be easily formed.

In the composite electronic device according to the present invention, preferably, the hole may be filled with a voltage-dependent material.

According to this configuration, the provision of the voltage-dependent material in the hole can discharge the static electricity generated in the inductor exceeding a predetermined voltage to the one end of the internal conductor and release to the ground via the other end of the internal conductor. This makes it possible to perform a stable static electricity suppressing function.

In the composite electronic device according to the present invention, it is preferable that the voltage-dependent material is a varistor material.

According to this configuration, a varistor material is used as the voltage-dependent material. Accordingly, when the static electricity which exceeds a predetermined voltage is applied, this static electricity can be more efficiently suppressed. At the same time, if the static electricity is equal to or below the predetermined voltage, the insulation between the inductor and the internal conductor can be secured.

In the composite electronic device according to the present invention, preferably, another coil conductor may be further arranged on at least one insulating layer of the plurality of insulating layers lying over the coil conductor.

According to this configuration, the two coil conductors are magnetically combined to realize a composite electronic device including a common mode drain noise filter or a multilayered transformer.

In the composite electronic device according to the present invention, it is preferable that the drawing conductor is made up of a first drawing conductor formed below the two coil conductors and a second drawing conductor formed above the two coil conductors.

According to this configuration, the drawing conductors electrically connected to the two coil conductors and the internal conductors can be formed in balance. This helps obtain a stable characteristic.

In the composite electronic device according to the present invention, preferably, the insulating layer between the two coil conductors may have a permittivity lower than any other insulating layer.

According to this configuration, the stray capacitance formed between the two coil conductors can be reduced, thus further eliminating high frequency noises.

In the composite electronic device according to the present invention, it is preferable that the insulating layer between the two coil conductors has a magnetic permeability lower than any other insulating layer.

According to this configuration, a magnetic flux generated in the two coil conductors can be prevented from leaking out, thus strengthening the magnetic coupling between the two coil conductors.

In the composite electronic device according to the present invention, it is preferable that the other end of the coil conductor, the other end of the drawing conductor and the other end of the internal conductor are drawn out to two opposite surfaces of the composite electronic device; the number of these ends drawn out to each surface is the same; and a surface to which the other end of the coil conductor is drawn out is different from a surface to which the other end of the drawing conductor connected to the coil conductor is drawn out.

According to this configuration, the composite electronic device can be easily used for a plurality of parallel signal lines.

INDUSTRIAL APPLICABILITY

A composite electronic device according to the present invention includes: an inductor for reducing noise in a signal line; and a static electricity regulator for releasing, to the ground, a static electricity generated in an inductor. This static electricity regulator is formed on one surface of the insulating layer where the inductor is formed. This provides an advantage in that the composite electronic device can be easily made thinner. Hence, it is useful as a noise filter, a device for regulating static electricity or the like which is used for various kinds of electronic apparatus such as digital apparatus, AV apparatus and an information communication terminal, or for another kind of apparatus.

The invention claimed is:

1. A composite electronic device comprising:
a plurality of insulating layers;
a coil conductor arranged on at least one of the plurality of insulating layers; and
an internal conductor arranged on the surface of the insulating layer that the coil conductor is arranged and having one end in the vicinity of a part of the coil conductor so that a static electricity generated in the coil conductor is discharged to the one end of the internal conductor and the discharged static electricity is released from the other end of the internal conductor to the ground,
the part of the coil conductor and the internal conductor constituting a static electricity regulator.

2. A composite electronic device comprising:
a plurality of insulating layers;
a coil conductor arranged on at least one of the plurality of insulating layers;
a drawing conductor arranged on another insulating layer and partially facing the coil conductor, and having one end electrically connected to one end of the coil conductor, the drawing conductor constituting an inductor for passing an external signal in combination with the coil conductor; and
an internal conductor arranged on a surface of the insulating layer on which the drawing conductor is arranged, and having one end in the vicinity of one end of the drawing conductor so that a static electricity generated in the inductor is discharged to the one end of the internal conductor and the discharged static electricity is released from the other end of the internal conductor to the ground,
the one end of the drawing conductor and the internal conductor constituting a static electricity regulator.

3. The composite electronic device according to claim 2, wherein a plurality of internal conductors are formed.

4. The composite electronic device according to claim 2, wherein the one end of the internal conductor is tapered.

5. The composite electronic device according to claim 2, wherein among the plurality of insulating layers, the insulating layers sandwiching the coil conductor are made of a magnetic material or a dielectric material.

6. The composite electronic device according to claim 2, wherein the insulating layers sandwiching the internal conductor are made of a glass material.

7. The composite electronic device according to claim 2, wherein: the insulating layer formed with the internal conductor and/or an insulating layer directly over the insulating layer have a hole; and the hole is at a position where at least the one end of the internal conductor comes in the hole.

8. The composite electronic device according to claim 7, wherein the hole is through the insulating layer.

9. The composite electronic device according to claim 8, wherein the hole is filled with a voltage-dependent material.

10. The composite electronic device according to claim 9, wherein the voltage-dependent material is a varistor material.

11. The composite electronic device according to claim 2, further comprising another coil conductor arranged on at least one insulating layer of the plurality of insulating layers lying over the coil conductor.

12. The composite electronic device according to claim 11, wherein a first drawing conductor is formed below the two coil conductors and a second drawing conductor is formed above the two coil conductors.

13. The composite electronic device according to claim 11, wherein the insulating layer between the two coil conductors has a permittivity lower than any other insulating layer.

14. The composite electronic device according to claim 11, wherein the insulating layer between the two coil conductors has a magnetic permeability lower than any other insulating layer.

15. The composite electronic device according to claim 11, wherein: the other end of the coil conductor, the other end of the drawing conductor and the other end of the internal conductor are extended out to two opposite surfaces of the composite electronic device; the number of the ends extended out on each of the opposite surfaces is the same; and the surface on which the other end of the coil conductor is extended out is different from the surface on which the other end of the drawing conductor connected to the coil conductor is extended out.

* * * * *